(12) United States Patent
Song et al.

(10) Patent No.: US 8,921,843 B2
(45) Date of Patent: Dec. 30, 2014

(54) ORGANIC LIGHT EMITTING DEVICE

(71) Applicant: Samsung Display Co., Ltd., Yongin (KR)

(72) Inventors: Ha-Jin Song, Yongin (KR); Se-Hun Kim, Yongin (KR); Dae-Yup Shin, Yongin (KR); Sang-Woo Lee, Yongin (KR); Sang-Woo Pyo, Yongin (KR); Byeong-Wook Yoo, Yongin (KR); Ji-Young Kwon, Yongin (KR); Bum-Suk Lee, Yongin (KR); Ji-Myoung Ye, Yongin (KR); Ji-Hwan Yoon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/922,211

(22) Filed: Jun. 19, 2013

(65) Prior Publication Data

US 2014/0217367 A1  Aug. 7, 2014

(30) Foreign Application Priority Data

Feb. 4, 2013  (KR) .................. 10-2013-0012606

(51) Int. Cl.
*H01L 29/08* (2006.01)
*H01L 51/50* (2006.01)
*H01L 51/00* (2006.01)

(52) U.S. Cl.
CPC .......... *H01L 51/005* (2013.01); *H01L 51/5048* (2013.01)
USPC ................. 257/40; 257/89; 438/82

(58) Field of Classification Search
USPC ........................ 257/40, 89; 438/82
See application file for complete search history.

(56) References Cited

U.S. PATENT DOCUMENTS 8,581,270 B2 * 11/2013 Park et al. ............. 257/89
2005/0186330 A1 * 8/2005 Kim et al. .............. 427/66

(Continued)

FOREIGN PATENT DOCUMENTS

KR  10-2004-0104225 A  12/2004
KR  10-2008-0081322 A  9/2008
KR  10-2009-0017859 A  2/2009

(Continued)

*Primary Examiner* — Douglas Menz

(74) *Attorney, Agent, or Firm* — Christie, Parker & Hale, LLP

(57) ABSTRACT

A full color light emitting device having a reduced driving voltage includes a substrate having a first subpixel, a second subpixel, and a third subpixel. A plurality of first electrodes are in the first subpixel, the second subpixel, and the third subpixel. A second electrode faces the first electrode. An emission layer is between the first electrode and the second electrode. The emission layer includes a first emission layer in the first subpixel for emitting a first color light in the first subpixel, a second emission layer in the first subpixel for emitting a second color light in the second subpixel, and a third emission layer in the first subpixel, the second subpixel and the third subpixel, for emitting a third color light in the third subpixel. The third emission layer includes at least one compound represented by Formula 1:

<Formula 1>

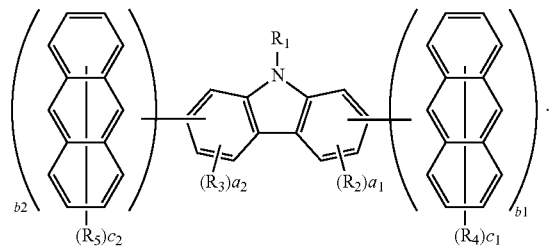

20 Claims, 2 Drawing Sheets

(56) References Cited

U.S. PATENT DOCUMENTS

| | | | |
|---|---|---|---|
| 2007/0046185 A1* | 3/2007 | Kim | 313/504 |
| 2009/0045739 A1 | 2/2009 | Kho et al. | |
| 2009/0200919 A1 | 8/2009 | Kamatani et al. | |
| 2009/0242911 A1* | 10/2009 | Ishihara et al. | 257/89 |
| 2010/0108997 A1 | 5/2010 | Kim et al. | |
| 2011/0240970 A1 | 10/2011 | Park et al. | |

FOREIGN PATENT DOCUMENTS

| | | |
|---|---|---|
| KR | 10-2010-0041043 A | 4/2010 |
| KR | 10-2011-0085178 A | 7/2011 |
| KR | 10-2011-0109559 A | 10/2011 |

* cited by examiner

ORGANIC LIGHT EMITTING DEVICE

CROSS-REFERENCE TO RELATED APPLICATION

This application claims priority to and the benefit of Korean Patent Application No. 10-2013-0012606, filed on Feb. 4, 2013 in the Korean Intellectual Property Office, the entire content of which is incorporated herein by reference.

BACKGROUND

1. Technical Field

The present disclosure relates to a full color organic light-emitting device having a reduced driving voltage.

2. Description of the Related Art

Organic light emitting devices (OLEDs) are self-emitting devices having advantages such as wide viewing angles, good contrast, quick response speeds, high brightness, and good driving voltage characteristics. Also, OLEDs can provide multicolored images.

A typical OLED has a structure including a substrate, and an anode, a hole transport layer (HTL), an emission layer (EML), an electron transport layer (ETL), and a cathode sequentially stacked on the substrate. In this regard, the HTL, the EML, and the ETL are organic thin films formed of organic compounds.

An operating principle of an OLED having the above-described structure is as follows. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

The present disclosure is directed to an organic light emitting device having a reduced driving voltage.

According to an aspect of the present invention, an organic light emitting device includes a substrate including a first subpixel, a second subpixel, and a third subpixel; a plurality of first electrodes separately formed in the first subpixel, the second subpixel, and the third subpixel; a second electrode facing the first electrode; and an emission layer between the first electrode and the second electrode. The emission layer includes i) a first emission layer for emitting a first color light formed in the first subpixel, ii) a second emission layer for emitting second color light formed in the second subpixel, and iii) a third emission layer formed as a common layer in the first subpixel, the second subpixel and the third subpixel, where the third emission layer emits a third color light in the third subpixel. The third emission layer includes at least one compound represented by Formula 1 below:

<Formula 1>

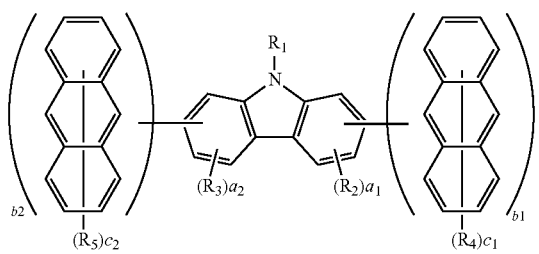

In Formula 1, $R_1$ to $R_5$ are each independently selected from a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group or a substituted or unsubstituted $C_6$-$C_{60}$ arylthio group. a1 and a2 are each independently an integer of 0 to 4, b1 and b2 are each independently an integer of 0 to 4, a1+b1 is 4, a2+b2 is 4, c1 and c2 are each independently an integer of 0 to 9, and b1 and b2 are not both 0.

According to another aspect of the present invention, a method of manufacturing an organic light emitting device includes: separately forming a plurality of first electrodes in a first subpixel, a second subpixel, and a third subpixel; forming a third emission layer as a common layer at the first subpixel, the second subpixel, and the third subpixel, where the third emission layer emits a third color light in the third subpixel; forming a first emission layer for emitting a first color light at the first subpixel and a second emission layer for emitting a second color light at the second subpixel; and forming a second electrode. The third emission layer includes at least one compound represented by Formula 1 below:

<Formula 1>

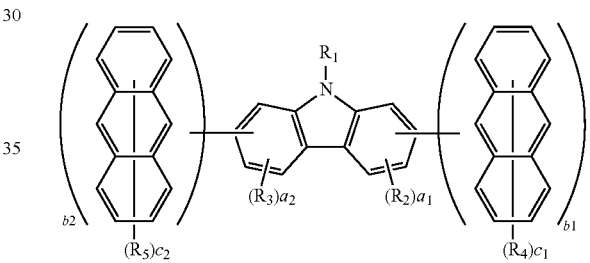

In Formula 1, $R_1$ to $R_5$ are each independently selected from a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group or a substituted or unsubstituted $C_6$-$C_{60}$ arylthio group. a1 and a2 are each independently an integer of 0 to 4, b1 and b2 are each independently an integer of 0 to 4, a1+b1 is 4, a2+b2 is 4, c1 and c2 are each independently an integer of 0 to 9, and b1 and b2 are not both 0.

BRIEF DESCRIPTION OF THE DRAWINGS

The above and other features and advantages of the present invention will become more apparent by reference to the following detailed description when considered in conjunction with the attached drawings, in which.

DETAILED DESCRIPTION

Figure 1:
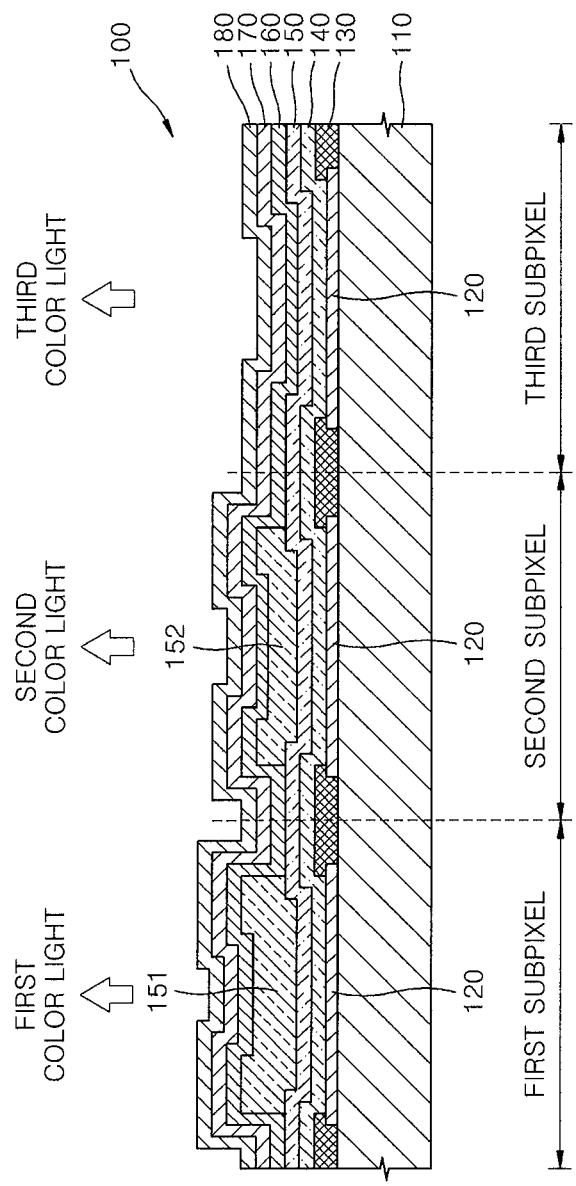
FIG. 1 is a schematic illustration of an organic light emitting device according to an embodiment of the present invention.

FIG. 1 schematically illustrates an organic light emitting device according to an embodiment of the present invention. Hereinafter, a structure of an organic light emitting device according to an embodiment of the present invention, as well as a method of preparing the organic light emitting device, will be described with reference to FIG. 1.

Referring to FIG. 1, a substrate 110 of an organic light emitting device 100 includes a first subpixel, a second subpixel, and a third subpixel. A plurality of first electrodes 120 are disposed as separate patterns in the first subpixel, the second subpixel, and the third subpixel. A hole injection layer 140 is formed on each of the plurality of first electrodes 120 as a common layer in the first subpixel, the second subpixel, and the third subpixel. An emission layer is formed on the hole injection layer 140. The emission layer includes a first emission layer 151 formed in the first subpixel and emitting a first color light, a second emission layer 152 formed in the second subpixel and emitting a second color light, and a third emission layer 150 formed as a common layer in the first subpixel, the second subpixel, and the third subpixel, and emitting a third color light. On the emission layer, an electron transport layer 160, an electron injecting layer 170, and the second electrode 180 are formed sequentially as common layers at the first subpixel, the second subpixel, and the third subpixel. The third emission layer 150 emits the third color light in the third subpixel.

The term "common layer," as used herein, refers to a layer that is not separately patterned for each of the red, green, and blue subpixels, but rather is formed commonly over all of the red, green, and blue subpixels.

The third emission layer 150 includes a first region located in the first subpixel, a second region located in the second subpixel, and a third region located in the third subpixel. The first region is located between the first emission layer 151 and a first electrode 120, and the second region is located between the second emission layer 152 and the first electrode 120. The third color light is emitted from the third region.

The first color light, the second color light and the third color light are red light, green light, and blue light, respectively. Accordingly, the organic light emitting device may emit a full color spectrum. However, the first color light, the second color light, and the third color light may be any of a variety of colors, and are not limited to red light, green light, and blue light, provided that the mixed light thereof is white light.

Any substrate which may generally be used in organic light emitting devices may be used as the substrate 110. For example, the substrate may be a glass substrate or a transparent plastic substrate having mechanical strength, thermal stability, transparency, surface finish, ease of handling, and waterproofness. The plurality of first electrodes 120 disposed as separate patterns in the first subpixel, the second subpixel, and the third subpixel are formed on the substrate 110. The first electrodes 120 may be formed by providing a first electrode material on the substrate 110 by a deposition method or a sputtering method. When the first electrode 120 is an anode, a first electrode material having a high work function may be selected for easy hole injection into the first emission layer 151, the second emission layer 152, and the third emission layer 150. The first electrode 120 may be a reflective electrode or a transmissive electrode.

In some embodiments, the first electrode 120 may include indium tin oxide (ITO), indium zinc oxide (IZO), tin oxide ($SnO_2$), zinc oxide (ZnO), Al-doped zinc oxide (AZO), indium oxide ($In_2O_3$), or the like, which are transparent and have high conductivity. In other embodiments, the first electrode 120 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 120 may have a single-layered structure or a multi-layered structure including at least two layers. In some embodiments, the first electrode 120 may be a triple-layered structure of ITO/Ag/ITO, but the first electrode 120 is not limited thereto.

Pixel defining layers 130 are formed on the edges of the plurality of first electrodes 120. The pixel defining layers 130 define pixel domains and may include various known organic insulating materials (for example, silicon-based materials), inorganic insulating materials, or organic/inorganic composite insulating materials.

The hole injection layer 140 is formed as a common layer on the plurality of first electrodes 120. The hole injection layer 140 may be formed to contact the plurality of first electrodes 120.

The hole injection layer 140 may be formed on the plurality of first electrodes 120 using vacuum deposition, spin coating, casting, Langmuir-Blodgett (LB) deposition, inkjet printing, laser printing, laser induced thermal imaging (LITI), or the like. When the hole injection layer 140 is formed using vacuum deposition, the vacuum deposition conditions may vary according to the material that is used to form the hole injection layer 140, and the desired structural and thermal properties of the hole injection layer 140. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the conditions are not limited thereto.

When the hole injection layer 140 is formed using spin coating, the coating conditions may vary according to the compound that is used to form the hole injection layer 140, and the desired structural and thermal properties of the hole injection layer 140. For example, the coating rate may be about 2000 rpm to about 5000 rpm, and the temperature at which heat treatment is performed to remove solvent after coating may be about 80° C. to about 200° C. However, the conditions are not limited thereto.

Non-limiting examples of materials that may be used to form the hole injection layer 140 include N,N'-diphenyl-N, N'-bis-[4-(phenyl-m-tolyl-amino)-phenyl]-biphenyl-4,4'-diamine (DNTPD), a phthalocyanine compound such as copper phthalocyanine, m-MTDATA [4,4',4"-tris(3-methylphenylphenylamino)triphenylamine], TDATA, 2-TNATA, Pani/DBSA (Polyaniline/Dodecylbenzenesulfonic acid), PEDOT/PSS (Poly(3,4-ethylenedioxythiophene)/Poly(4-styrenesulfonate), Pani/CSA (Polyaniline/Camphor sulfonic acid), and PANI/PSS (Polyaniline)/Poly(4-styrenesulfonate).

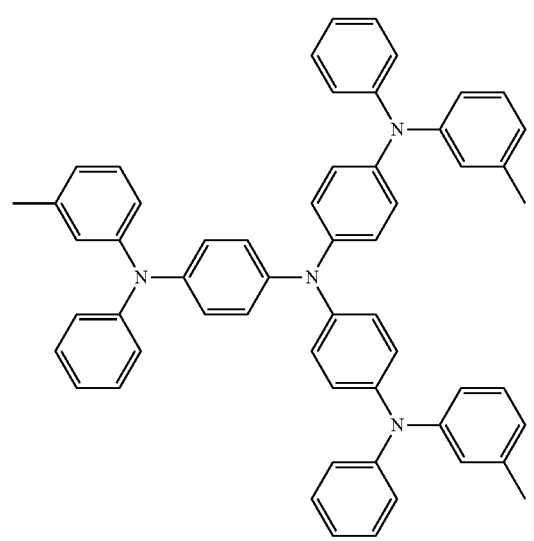

m-MTDATA

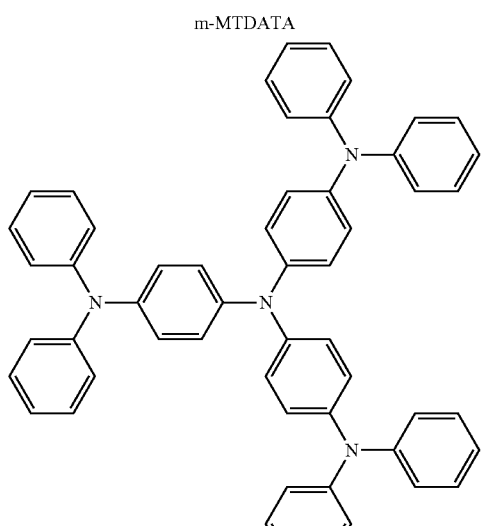

TDATA

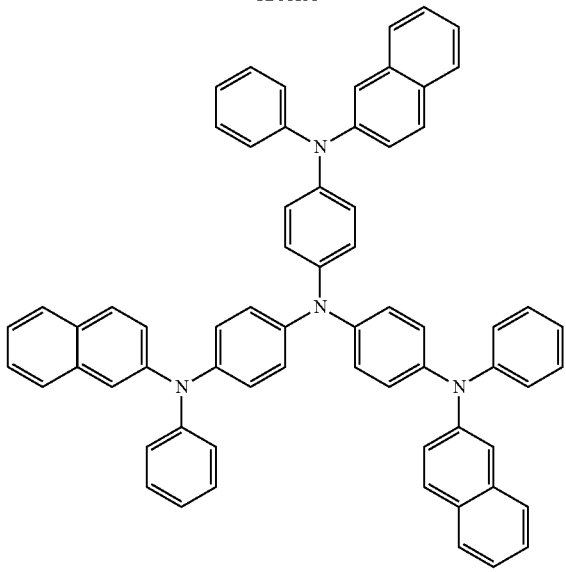

2-TNATA

The thickness of the hole injection layer 140 may be about 100 Å to about 10000 Å. In some embodiments, the thickness may be about 100 Å to about 1500 Å. When the thickness of the hole injection layer 140 is within these ranges, satisfactory hole injecting capabilities may be obtained without a substantial increase in driving voltage.

In addition to the hole injection materials described above, the hole injection layer 140 may further include a charge generating material for improving the conductivity and the like of the hole injection layer 140. In some embodiments, the charge generating material may be a p-dopant. Non-limiting examples of the p-dopant include quinone derivatives such as tetracyanoquinonedimethane (TCNQ) and 2,3,5,6-tetrafluoro-tetracyano-1,4-benzoquinonedimethane (F4TCNQ); metal oxides such as tungsten oxide and molybdenum oxide; and cyano-containing compounds such as Compound 100 below.

<Compound 100>

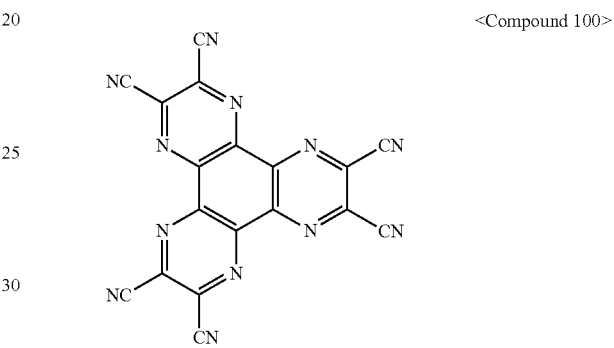

When the hole injection layer 140 further includes the charge generating material, the charge generating material may be homogeneously dispersed or inhomogeneously dispersed in the hole injection layer 140, or may be formed in various forms.

On the hole injection layer 140, a hole transport layer (not shown in FIG. 1) may be further formed using a variety of methods, such as vacuum deposition, spin coating, casting, Langmuir-Blodgett (LB) deposition, or the like. When the hole transport layer is formed by vacuum deposition or spin coating, the deposition or coating conditions may vary according to the compound used to form the hole transport layer. However, in general, the deposition or coating conditions may be similar to those described above for forming the hole injection layer 140.

Non-limiting examples of hole transport materials include carbazole derivatives such as N-phenylcarbazole and polyvinylcarbazole, N,N'-bis(3-methylphenyl)-N,N'-diphenyl-[1,1-biphenyl]-4,4'-diamine (TPD), TCTA (4,4',4''-tris(N-carbazolyl)triphenylamine)), and NPB (N,N'-di(1-naphthyl)-N,N'-diphenylbenzidine)).

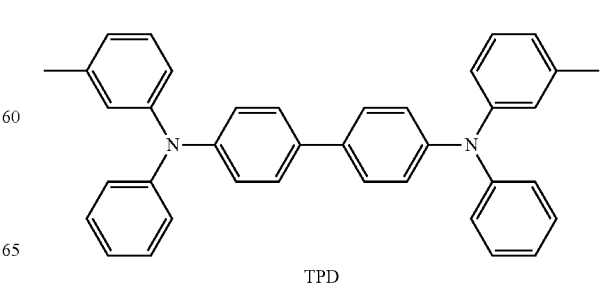

TPD

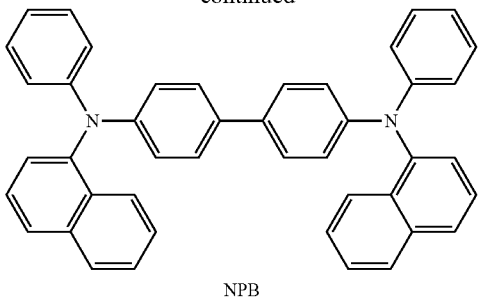

NPB

The thickness of the hole transport layer may be about 50 Å to about 2000 Å, and in some embodiments, the thickness may be about 100 Å to about 1500 Å. When the thickness of the hole transport layer is within these ranges, satisfactory hole transport capabilities may be obtained without a substantial increase in driving voltage.

In addition to the hole transport materials, the hole transport layer may further include a charge generating material for improving the conductivity and the like of the hole transport layer. The charge generating material may be the same as described above with respect to the hole injecting layer.

When the hole transport layer further includes the charge-generating material, the charge generating material may be homogeneously dispersed or inhomogeneously in the hole transport layer, or may be formed in various forms.

On the hole injection layer 140, the third emission layer 150 is provided as a common layer. The hole injection layer 140 and the third emission layer 150 may contact each other. When the hole transport layer is further included, the third emission layer 150 may be included as a common layer on the hole transport layer, and the hole transport layer and the third emission layer 150 may contact each other.

On the hole injection layer 140 or the hole transport layer, the third emission layer 150 may be formed using vacuum deposition, spin coating, casting, Langmuir-Blodgett (LB) deposition, inkjet printing, laser printing, laser induced thermal imaging (LITI), or the like. When the third emission layer 150 is formed by vacuum deposition or spin coating, the deposition or coating conditions may vary according to the compound used to form the third emission layer. However, in general, the deposition conditions may be similar to those described above for forming the hole injection layer 140.

The third emission layer 150 includes a first region located in the first subpixel, a second region located in the second subpixel, and a third region located in the third subpixel. The first region may transport holes from the first electrode 120 to the first emission layer 151; the second region may transport holes from the first electrode 120 to the second emission layer 152; and the third region may emit the third color light. Hence, in the first subpixel, emission of the third color light by the third emission layer 150 does not occur substantially, and in the second subpixel, emission of the third color light by the third emission layer does not occur substantially.

The third emission layer 150 may include a compound having both hole transport ability and the ability to emit the third color light. For example, when the third color light is blue light, the third emission layer 150 may include a compound having both hole transport ability and the ability to emit blue light.

For example, the third emission layer 150 may include at least one compound represented by Formula 1 below:

<Formula 1>

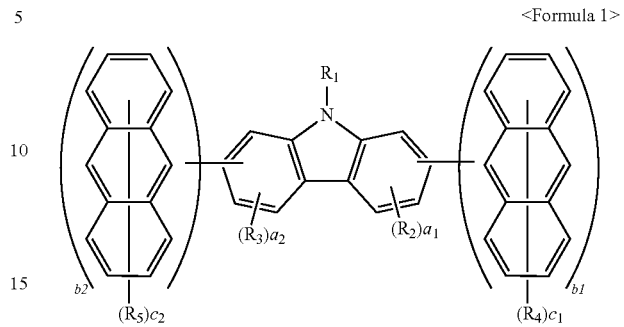

In Formula 1, $R_1$ to $R_5$ may be each independently selected from a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group or a substituted or unsubstituted $C_6$-$C_{60}$ arylthio group. a1 and a2 may be each independently an integer of 0 to 4; b1 and b2 may be each independently an integer of 0 to 4; a1+b1 is 4; a2+b2 is 4; c1 and c2 may be each independently an integer of 0 to 9; and b1 and b2 are not both 0.

For example, in Formula 1, $R_1$ to $R_5$ may be each independently selected from a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group or a substituted or unsubstituted $C_6$-$C_{60}$ arylthio group, but $R_1$ to $R_5$ are not limited thereto.

In some embodiments, $R_1$ to $R_5$ may be each independently selected from a hydrogen atom; a $C_1$-$C_{10}$ alkyl group; a $C_6$-$C_{14}$ aryl group; a $C_2$-$C_{14}$ heteroaryl group;

a $C_1$-$C_{10}$ alkyl group, a $C_6$-$C_{14}$ aryl group, or a $C_2$-$C_{14}$ heteroaryl group substituted with at least one of a deuterium atom, a halogen atom, a hydroxyl group, a cyano group, a nitro group, or a carboxyl group;

a $C_1$-$C_{10}$ alkyl group, a $C_6$-$C_{14}$ aryl group, or a $C_2$-$C_{14}$ heteroaryl group substituted with at least one of a methyl group, an ethyl group, an n-propyl group, an i-propyl group, an n-butyl group, an iso-butyl group, a tert-butyl group, a pentyl group, and a hexyl group; or a $C_1$-$C_{10}$ alkyl group, a $C_6$-$C_{14}$ aryl group or a $C_2$-$C_{14}$ heteroaryl group, each substituted with at least one of a phenyl group, a naphthyl group, an anthryl group, a carbazolyl group, a fluorenyl group, a pyridyl group, a pyrimidinyl group, a pyrazinyl group, or a triazinyl group. However, $R_1$ to $R_5$ are not limited thereto.

In other embodiments, $R_1$ to $R_5$ may be each independently a hydrogen atom; a methyl group, an ethyl group, an n-propyl group, an iso-propyl group, an n-butyl group, an iso-butyl group, a tert-butyl group, a pentyl group, or a hexyl group;

a phenyl group, a naphthyl group, an anthryl group, or a fluorenyl group;

a carbazolyl group, a pyridyl group, a pyrimidinyl group, a pyrazinyl group, or a triazinyl group;

a methyl group, an ethyl group, an n-propyl group, an iso-propyl group, an n-butyl group, an iso-butyl group, a tert-butyl group, a pentyl group, a hexyl group, a phenyl group, a naphthyl group, an anthryl group, a fluorenyl group, a carbazolyl group, a pyridyl group, a pyrimidinyl group, a pyrazinyl group, or a triazinyl group substituted with at least one of a hydrogen atom, a halogen atom, a hydroxyl group, a cyano group, a nitro group, or a carboxyl group;

a methyl group, an ethyl group, an n-propyl group, an iso-propyl group, an n-butyl group, an iso-butyl group, a tert-butyl group, a pentyl group, a hexyl group, a phenyl group, a naphthyl group, an anthryl group, a fluorenyl group, a carbazolyl group, a pyridyl group, a pyrimidinyl group, a pyrazinyl group, or a triazinyl group substituted with at least one of a methyl group, an ethyl group, an n-propyl group, an iso-propyl group, an n-butyl group, an iso-butyl group, a tert-butyl group, a pentyl group, or a hexyl group; or a methyl group, an ethyl group, an n-propyl group, an iso-propyl group, an n-butyl group, an iso-butyl group, a tert-butyl group, a pentyl group, a hexyl group, a phenyl group, a naphthyl group, an anthryl group, a fluorenyl group, a carbazolyl group, a pyridyl group, a pyrimidinyl group, a pyrazinyl group, or a triazinyl group substituted with at least one of a phenyl group, a naphthyl group, an anthryl group, a carbazolyl group, a fluorenyl group, a pyridyl group, a pyrimidinyl group, a pyrazinyl group, or a triazinyl group. However, $R_1$ to $R_5$ are not limited thereto.

In Formula 1, a1 and a2 may be each independently an integer of 0 to 4, but are not limited thereto. For example, in Formula 1, a1 and a2 may be each independently an integer of 0 to 2, but are not limited thereto. When a1 and a2 are integers of 2 or greater, the plurality of $R_2$s and/or $R_3$s may be each independently the same or different from each other.

In Formula 1, b1 and b2 may be each independently an integer of 0 to 4, but are not limited thereto. In some embodiments, in Formula 1, a1 and b2 may be each independently an integer of 0 to 2, but are not limited thereto. When b1 and b2 are 2 or greater, the plurality of moieties represented by

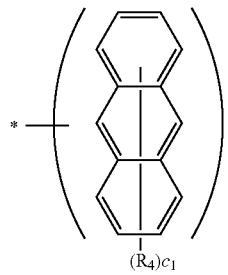

(where * is a binding site to the carbazole of Formula 1) may be each independently the same or different from each other.

In some embodiments, in Formula 1, b1 may be 1. In other embodiments, b2 may be 0, b1 may be 0, and b2 may be 1. Hence, a case where b1 and b2 are both 0 is excluded.

In Formula 1, a1+b1 may be 4 and a2+b2 may be 4. Hence, all carbons that are not substituted with the carbazole of Formula 1, $R_2$ and $R_3$, are substituted with the moiety represented by

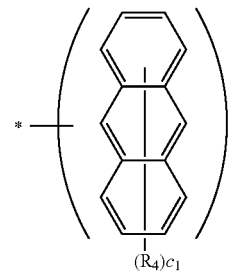

(where * is a binding site to the carbazole of Formula 1) and/or the moiety represented by

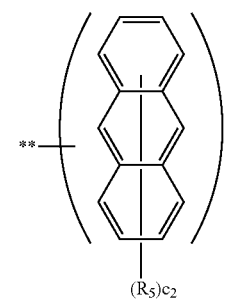

(where * is a binding site to the carbazole of Formula 1).

In some embodiments, Formula 1 may be represented by Formula 2 below, but Formula 1 is not limited thereto:

<Formula 2>

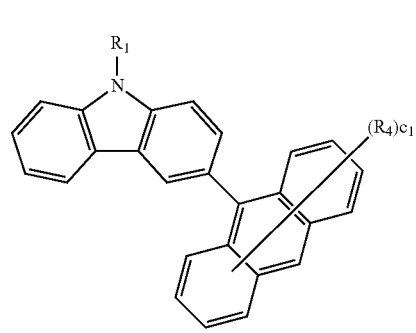

$R_1$, $R_4$ and c1 of Formula 2 are the same as described above with respect to Formula 1.

In some embodiments, in Formula 2, $R_1$ and $R_4$ may be each independently selected from a $C_1$-$C_{10}$ alkyl group; a $C_6$-$C_{14}$ aryl group; a $C_2$-$C_{14}$ heteroaryl group; or a $C_1$-$C_{10}$ alkyl group, a $C_6$-$C_{14}$ aryl group, or a $C_2$-$C_{14}$ heteroaryl group substituted with at least one of a deuterium atom, a halogen atom, a hydroxyl group, a cyano group, a nitro group, or a carboxyl group;

a $C_1$-$C_{10}$ alkyl group, a $C_6$-$C_{14}$ aryl group or a $C_2$-$C_{14}$ heteroaryl group substituted with at least one of a methyl group, an ethyl group, an n-propyl group, an iso-propyl group, an n-butyl group, an iso-butyl group, a tert-butyl group, a pentyl group, or a hexyl group; or a $C_1$-$C_{10}$ alkyl group, a $C_6$-$C_{14}$ aryl group or a $C_2$-$C_{14}$ heteroaryl group substituted with at least one of a phenyl group, a naphthyl group, an anthryl group, a carbazolyl group, a fluorenyl group, a pyridyl group, a pyrimidinyl group, a pyrazinyl group, or a triazinyl group. However, $R_1$ and $R_4$ are not limited thereto.

In other embodiments, in Formula 2, $R_1$ and $R_4$ may be each independently selected from a methyl group, an ethyl group, an n-propyl group, an iso-propyl group, an n-butyl group, an iso-butyl group, a tert-butyl group, a pentyl group or a hexyl group; a phenyl group, a naphthyl group, an anthryl group, or a fluorenyl group;

a carbazolyl group, a pyridyl group, a pyrimidinyl group, a pyrazinyl group, or a triazinyl group;

a methyl group, an ethyl group, an n-propyl group, an iso-propyl group, an n-butyl group, an iso-butyl group, a t-butyl group, a pentyl group, a hexyl group, a phenyl group, a naphthyl group, an anthryl group, a fluorenyl group, a carbazolyl group, a pyridinyl group, a pyrimidinyl group, a pyrazinyl group, or a triazinyl group substituted with at least one of a deuterium atom, a halogen atom, a hydroxyl group, a cyano group, a nitro group, or a carboxyl group;

a methyl group, an ethyl group, an n-propyl group, an i-propyl group, an n-butyl group, an i-butyl group, a t-butyl group, a pentyl group, a hexyl group, a phenyl group, a naphthyl group, an anthryl group, a fluorenyl group, a carbazolyl group, a pyridinyl group, a pyrimidinyl group, a pyrazinyl group, and a triazinyl group substituted with at least one of a methyl group, an ethyl group, an n-propyl group, an i-propyl group, an n-butyl group, an i-butyl group, a t-butyl group, a pentyl group, or a hexyl group; or a methyl group, an ethyl group, an n-propyl group, an i-propyl group, an n-butyl group, an i-butyl group, a t-butyl group, a pentyl group, a hexyl group, a phenyl group, a naphthyl group, an anthryl group, a fluorenyl group, a carbazolyl group, a pyridinyl group, a pyrimidinyl group, a pyrazinyl group, or a triazinyl group substituted with at least one of a phenyl group, a naphthyl group, an anthryl group, a carbazolyl group, a fluorenyl group, a pyridinyl group, a pyrimidinyl group, a pyrazinyl group, or a triazinyl group.

In Formula 2, c1 may be 0 or 1, but is not limited thereto. In some embodiments, in Formula 2, c1 may be 1. In Formula 2, when c1 is 0, all carbons of the anthracenyl group of Formula 2 are unsubstituted.

In some embodiments, Formula 1 may be represented by Formula 3, but Formula 1 is not limited thereto:

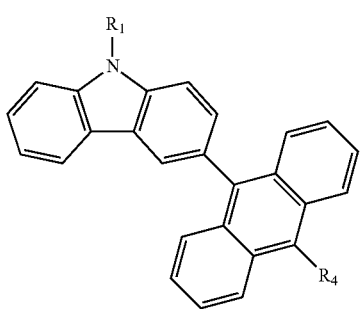

<Formula 3>

In Formula 3, $R_1$ and $R_4$ are the same as described above with respect to Formulae 1 and 2.

In some embodiments, in Formula 3, $R_1$ may be a methyl group, an ethyl group, an n-propyl group, an i-propyl group, an n-butyl group, an i-butyl group, a t-butyl group, a pentyl group or a hexyl group; a phenyl group, an anthryl group, or a fluorenyl group;

a methyl group, an ethyl group, an n-propyl group, an i-propyl group, an n-butyl group, an i-butyl group, a t-butyl group, a pentyl group, a hexyl group, a phenyl group, a naphthyl group, an anthryl group, or a fluorenyl group substituted with at least one of a phenyl group, a naphthyl group, an anthryl group, or a fluorenyl group. However, $R_1$ is not limited thereto.

In some embodiments, in Formula 3, $R_4$ may be selected from a phenyl group, a naphthyl group, an anthryl group, or a fluorenyl group; or a phenyl group, a naphthyl group, an anthryl group or a fluorenyl group substituted with at least one of a phenyl group, a naphthyl group, an anthryl group or a fluorenyl group. However, $R_4$ is not limited thereto.

In some embodiments, Formula 1 may include at least one of Compounds 1 to 4, but Formula 1 is not limited thereto:

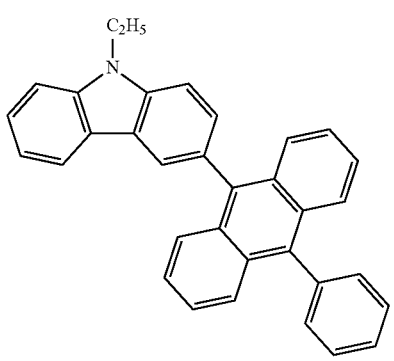

<Compound 1>

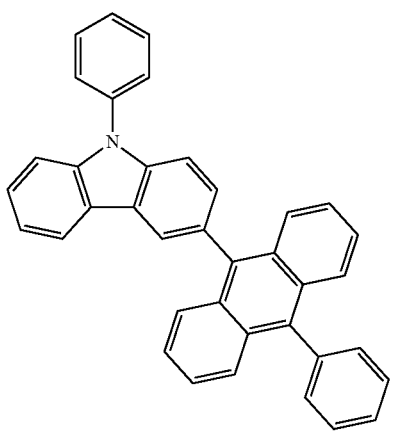

<Compound 2>

-continued

<Compound 3>

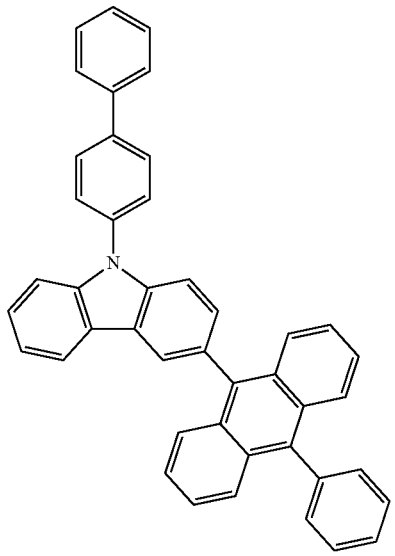

<Compound 4>

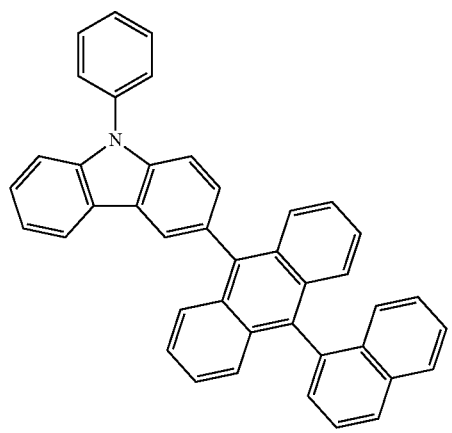

Specific examples of the unsubstituted $C_1$-$C_{60}$ alkyl group (or a $C_1$-$C_{60}$ alkyl group) include methyl, ethyl, propyl, isobutyl, sec-butyl, pentyl, iso-amyl, hexyl, and the like. The substituted $C_1$-$C_{60}$ alkyl group refers to the substitution of at least one hydrogen atom of the unsubstituted $C_1$-$C_{60}$ alkyl group with a halogen atom, a hydroxy group, a nitro group, a cyano group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a C2-C30 alkynyl group, a $C_6$-$C_{30}$ aryl group, a $C_2$-$C_{20}$ heteroaryl group, —N($Q_1$)($Q_2$), or —Si($Q_3$)($Q_4$)($Q_5$), where $Q_1$ to $Q_5$ may be each independently selected from a hydrogen atom, a $C_1$-$C_{30}$ alkyl group, a $C_2$-$C_{30}$ alkenyl group, a $C_2$-$C_{30}$ alkynyl group, a $C_6$-$C_{30}$ aryl group, and a $C_2$-$C_{20}$ heteroaryl group.

Specific examples of the unsubstituted $C_3$-$C_{60}$ cycloalkyl group (or $C_3$-$C_{60}$ cycloalkyl group) include a cyclopropyl group, a cyclobutyl group, a cyclopentyl group, a cyclohexyl group, and the like. The substituted $C_3$-$C_{60}$ cycloalkyl group refers to the substitution of at least one hydrogen atom of the cycloalkyl group with the substituents described above with respect to the substituted $C_1$-$C_{60}$ alkyl group.

The unsubstituted $C_1$-$C_{60}$ alkoxy group (or $C_1$-$C_{60}$ alkoxy group) is represented by —O$A_1$, where $A_1$ is the unsubstituted $C_1$-$C_{60}$ alkyl group described above. Specific examples of the unsubstituted $C_1$-$C_{60}$ alkoxy group include methoxy, ethoxy, isopropyloxy, and the like. The substituted $C_1$-$C_{60}$ alkoxy group refers to the substitution of at least one hydrogen atom of the alkoxy group with the substituents described above with respect to the substituted $C_1$-$C_{60}$ alkyl group.

The unsubstituted $C_6$-$C_{60}$ aryl group is a monovalent group having a carbocyclic aromatic system with 6 to 60 carbon atoms including at least one aromatic ring. When the aryl group includes two or more rings, the two or more rings may be fused. The substituted $C_6$-$C_{60}$ aryl group or refers to the substitution of at least one hydrogen atom of the aryl group with the substituents described above with respect to the substituted $C_1$-$C_{60}$ alkyl group.

Examples of the substituted or unsubstituted $C_6$-$C_{60}$ aryl group include a phenyl group, a $C_1$-$C_{10}$ alkylphenyl group (for example, an ethyl phenyl group), a $C_1$-$C_{10}$ alkyl biphenyl group (for example, an ethyl biphenyl group), a halophenyl group (for example, an o-, m- or a p-fluorophenyl group or a dichlorophenyl group), a dicyanophenyl group, a trifluoromethoxyphenyl group, an o-, m-, or p-tolyl group, an o-, m- or p-cumenyl group, a mesityl group, a phenoxyphenyl group, a (α,α-dimethylbenzene)phenyl group, an (N,N'-dimethyl)aminophenyl group, an (N,N'-diphenyl)aminophenyl group, a pentalenyl group, an indenyl group, a naphthyl group, a halonaphthyl group (for example, a fluoronaphthyl group), a $C_1$-$C_{10}$ alkyl naphthyl group (for example, methyl naphthyl group), a $C_1$-$C_{10}$ alkoxy naphthyl group (for example, methoxy naphthyl group), an anthracenyl group, an azulenyl group, a heptalenyl group, an acenaphthylenyl group, a phenalenyl group, a fluorenyl group, an anthraquinolyl group, a methyl anthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, and the like. Examples of the substituted $C_6$-$C_{60}$ aryl group may be inferred based on the examples of substituents of the unsubstituted $C_6$-$C_{60}$ aryl group and the substituted $C_1$-$C_{60}$ alkyl group above. Examples of the substituted or unsubstituted $C_6$-$C_{60}$ arylene group may be inferred based on the examples of the substituted or unsubstituted $C_6$-$C_{60}$ aryl group.

The unsubstituted $C_2$-$C_{60}$ heteroaryl group includes at least one aromatic ring in which at least one ring atom is a heteroatom selected from N, O, P or S, and the remaining ring atoms are C. When the heteroaryl group includes two or more rings, the two rings may be fused. The substituted $C_2$-$C_{60}$ heteroaryl group refers to the substitution of at least one hydrogen atom of the heteroaryl group with the substituents described above with respect to the substituted $C_1$-$C_{60}$ alkyl group.

Examples of the unsubstituted $C_2$-$C_{60}$ heteroaryl group include a pyrazolyl group, an imidazolyl group, an oxazolyl group, a diazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, and the like.

The unsubstituted $C_6$-$C_{60}$ aryloxy group is represented by —O$A_2$ (where $A_2$ is the unsubstituted $C_6$-$C_{60}$ aryl group described above). The unsubstituted $C_6$-$C_{60}$ arylthio group is represented by Formula of —S$A_3$ (where $A_3$ is the unsubstituted $C_6$-$C_{60}$ aryl group described above). The substituted $C_6$-$C_{60}$ aryloxy group and substituted $C_6$-$C_{60}$ arylthio group refer to the substitution of at least one hydrogen atom of the aryloxy group or the arylthio group with the substituents described above with respect to the substituted $C_1$-$C_{60}$ alkyl group.

An absolute value of the HOMO (highest occupied molecular orbital) of the compound represented by Formula 1 may be less than 5.5 eV. In some embodiments, the absolute value of the HOMO of the compound represented by Formula 1 may be about 5.0 eV to about 5.5 eV. When a compound having an absolute value of the HOMO within the above ranges is used in the emission layer, the hole transport capability of the emission layer improves, and the holes may be easily transported from the hole injection layer to the emission layer. Accordingly, the driving voltage of the organic light emitting device may be reduced. In some embodiments, the absolute value of the HOMO of the compound represented by Formula 1 may be greater than the absolute values of the HOMOs of the first electrode and the hole injection layer, but the present invention is not limited thereto. Also, the absolute value of the HOMO of the compound represented by Formula 1 may be greater than the absolute values of the HOMOs of the first emission layer and the second emission layer, but the present invention is not limited thereto.

When the hole injection layer 140 directly contacts the third emission layer 150, the difference between the absolute values of the HOMO of the compound represented by Formula 1 and the absolute value of the HOMO of the hole injection layer may be 0.5 eV or less, but the present invention is not limited thereto.

When the difference between the absolute value of the HOMO of the compound represented by Formula 1 and the absolute value of the HOMO of the hole injection layer is adjusted to 0.5 eV or less, the hole barrier decreases and hole transport from the hole injection layer to the emission layer is facilitated. Accordingly, the driving voltage of the organic light emitting device may decrease. In some embodiments, the difference between the absolute value of the HOMO of the compound represented by Formula 1 and the absolute value of the HOMO of the hole injection layer may be about 0 eV to about 0.1 eV.

In addition to the compound represented by Formula 1, the third emission layer 150 may further include a fluorescent dopant or a phosphorescent dopant which emits a third color light. When the third color light is blue colored light, the third emission layer 150 may further include a blue dopant.

Examples of the blue dopant may include $F_2$Irpic, $(F_2ppy)_2$Ir(tmd), Ir(dfppz)$_3$, terfluorene, 4,4'-bis(4-diphenylaminostyryl) biphenyl(DPAVBi), 2,5,8,11-tetra-tert-butyl perylene (TBPe), DPVBi, and the like, but the blue dopant is not limited thereto.

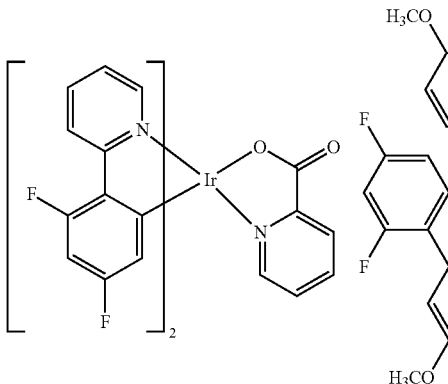

F$_2$Irpic

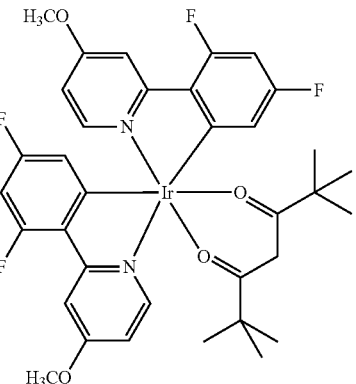

(F$_2$ppy)$_2$Ir(tmd)

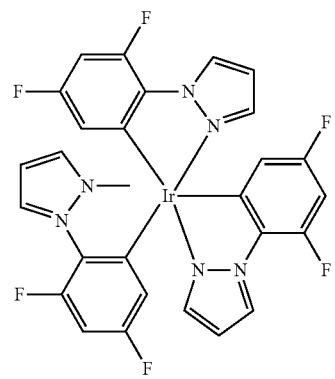

Ir(dfppz)$_3$

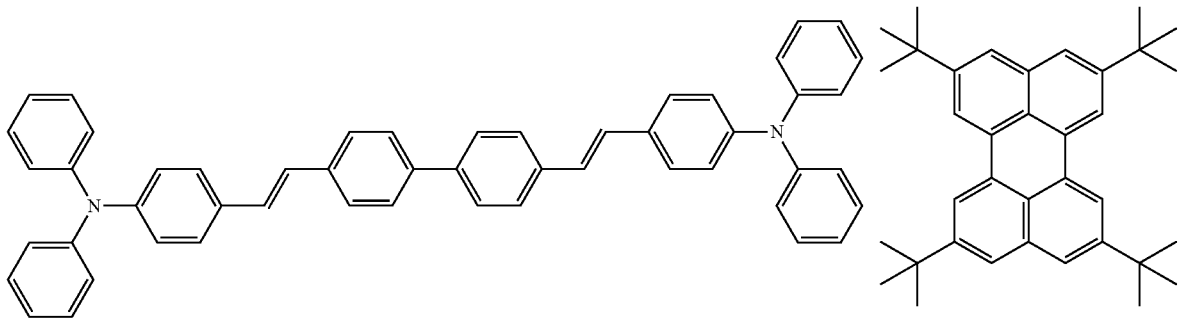

DPAVBi

TBPe

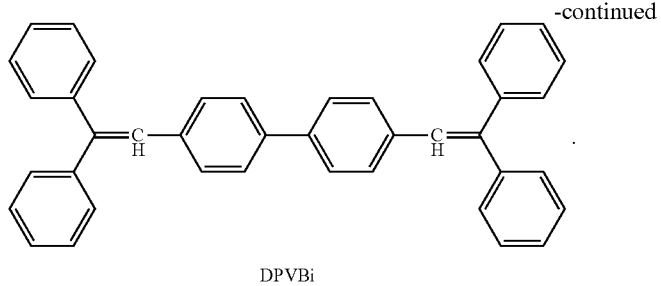
DPVBi

In addition to the compound represented by Formula 1, the third emission layer 150 may further include a p-dopant. Non-limiting examples of the p-dopant include quinone derivatives such as tetracyanoquinonedimethane (TCNQ), and 2,3,5,6-tetrafluoro-tetracyano-1,4-benzoquinonedimethane (F4TCNQ); metal oxides such as tungsten oxide, and molybdenum oxide; and cyano group-containing compounds such as (2-(7-dicyanomethylene-1,3,4,5,6,8,9,10-octafluoro-7H-pyrene-2-ylidene)-malononitrile) (NDP-9), and Compound 100 below, but the p-dopant is not limited thereto.

<Compound 100>

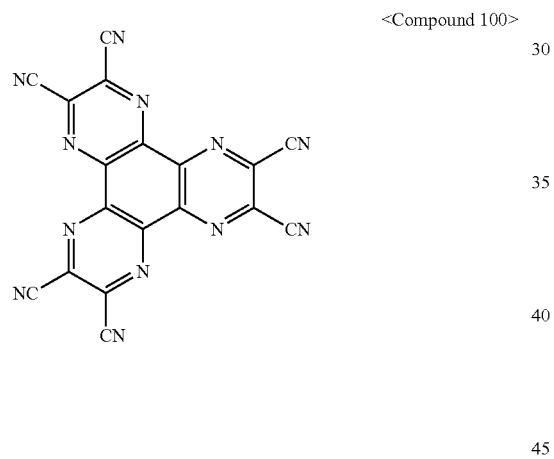

The amount of the dopant may be about 0.01 part by weight to about 15 parts by weight based on 100 parts by weight of the compound represented by Formula 1, but the present invention is not limited thereto.

The thickness of the third emission layer may be about 100 Å to about 500 Å, and in some embodiments, the thickness may be about 150 Å to about 300 Å. When the thickness of the third emission layer 150 is within these ranges, an organic light emitting device may be obtained without a substantial increase in driving voltage.

The first emission layer 151 and the second emission layer may include a fluorescent material. For example, the first emission layer and the second emission layer may include a host and a dopant.

Non-limiting examples of the host include Alq$_3$, CBP (4,4'-N,N'-dicarbazole-biphenyl), PVK (polyvinylcarbazole), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), and the like.

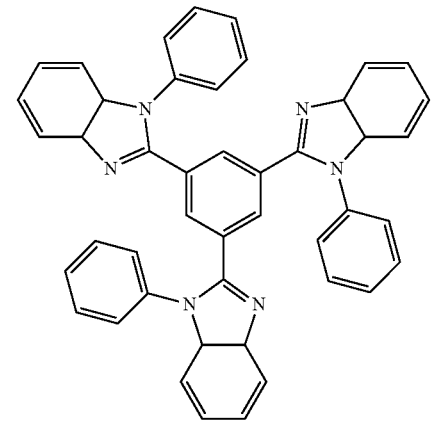
TPBi

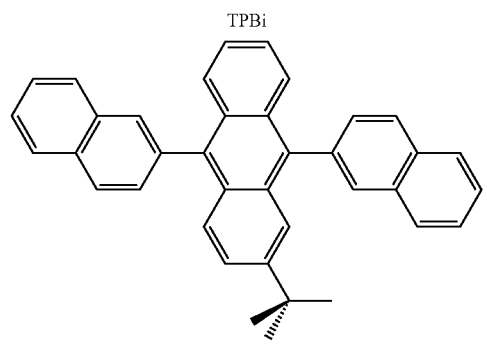
TBADN

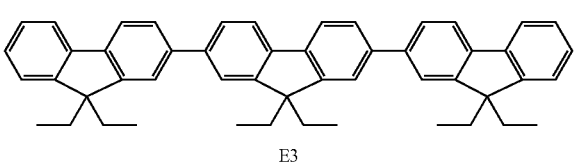
E3

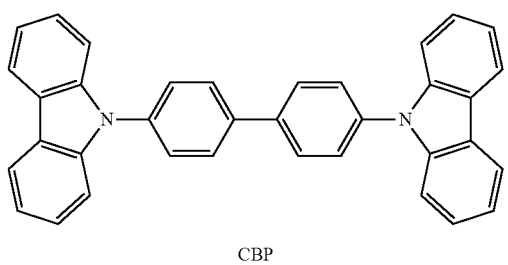
CBP

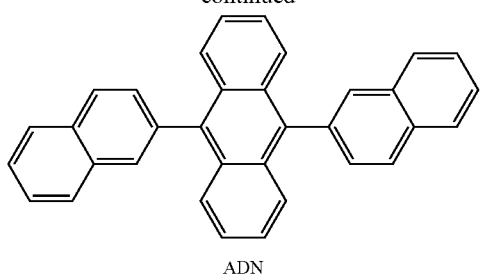

ADN

The dopant may be at least one of a fluorescent dopant or a phosphorescent dopant. In some embodiments, the phosphorescent dopant may be an organic metal compound including a combination of at least two of iridium (Ir), platinum (Pt), osmium (Os), rhenium (Re) titanium (Ti), zirconium (Zr), and hafnium (Hf), but the phosphorescent dopant is not limited thereto.

When the first color light is red, PtOEP, Ir(piq)$_3$, Btplr, or the like may be used as a red dopant, but the red dopant is not limited thereto.

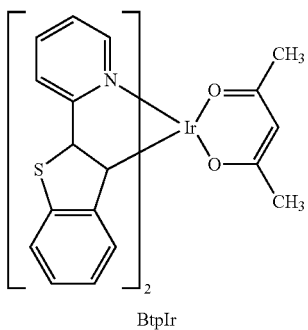

BtpIr

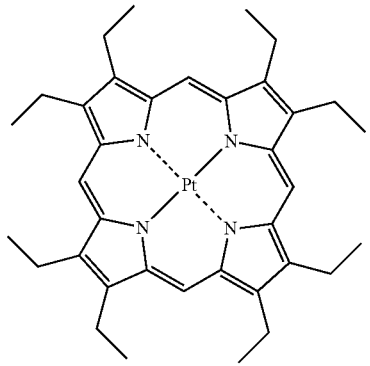

PtOEP

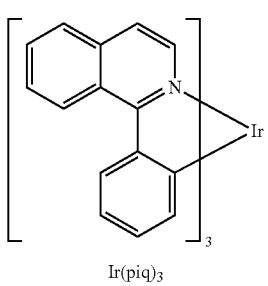

Ir(piq)$_3$

When the second color light is green, Ir(ppy)$_3$ (ppy=phenylpyridine), Ir(ppy)$_2$(acac), Ir(mpyp)$_3$, or the like may be used as a green dopant, but the green dopant is not limited thereto.

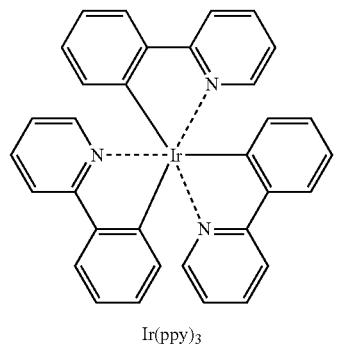

Ir(ppy)$_3$

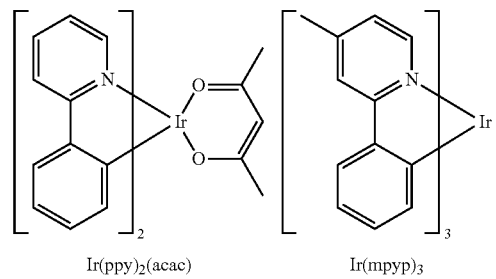

Ir(ppy)$_2$(acac)     Ir(mpyp)$_3$

When the first emission layer 151 and/or the second emission layer 152 include a host and a dopant, the content of the dopant may generally be about 0.01 parts by weight to about 15 parts by weight based on 100 parts by weight of the host, but the present invention is not limited thereto.

The thicknesses of the first emission layer 151 and the second emission layer 152 may be each independently about 100 Å to 1000 Å. In some embodiments, the thicknesses may be about 200 Å to about 600 Å. When the thicknesses of the first emission layer 151 and the second emission layer 152 are within these ranges, satisfactory hole transport capabilities may be obtained without a substantial increase in a driving voltage.

When the first emission layer 151 and the second emission layer 152 include a phosphorescent dopant and when the first emission layer 151 and the second emission layer 152 are used together, a hole blocking layer (HBL) (not shown in FIG. 1) may be formed by vacuum deposition, spin coating, casting, Langmuir-Blodgett (LB) deposition, inkjet printing, laser printing, laser induced thermal imaging (LITI) or the like before forming the hole transport layer 160. The hole blocking layer prevents diffusion of triplet excitons or holes into the electron transport layer 160. When the HBL is formed by vacuum deposition or spin coating, the conditions for deposition or coating may be similar to those described above for the formation of the hole injection layer 140. However, the conditions for deposition or coating may vary according to the material that is used to form the hole injection layer 140. Any known hole blocking material may be used. Non-limiting examples of hole blocking materials include oxadiazole derivatives, triazole derivatives, phenanthroline derivatives, Balq, and the like.

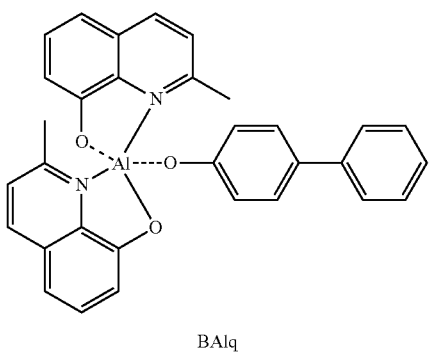

BAlq

The thickness of the hole blocking layer may be about 10 Å to about 1000 Å, and in some embodiments, the thickness of the hole blocking layer may be about 30 Å to about 300 Å. When the thickness of the hole blocking layer is within these ranges, satisfactory hole blocking capabilities may be obtained without a substantial increase in a driving voltage.

Thereafter, the electron transport layer 160 is formed over all of the first subpixel, the second subpixel, and the third subpixel by vacuum deposition, spin coating, casting, or the like. When the electron transport layer 160 is formed by vacuum deposition or spin coating, the conditions for deposition or coating may be similar to those described above for the formation of the hole injection layer 140. However, the conditions for deposition and coating may vary according to the material that is used to form the electron transport layer 160. Any known electron transport material that stably transports electrons injected from the second electrode 180 may be used as the material for the hole transport layer 160. Examples of the material for the hole transport layer 160 include quinoline derivatives, specifically, tris(8-quinolinolate)aluminum (Alq3), TAZ, Balq, beryllium bis(benzoquinolin-10-olate) (Bebq$_2$), and the like, but the hole transport material is not limited thereto.

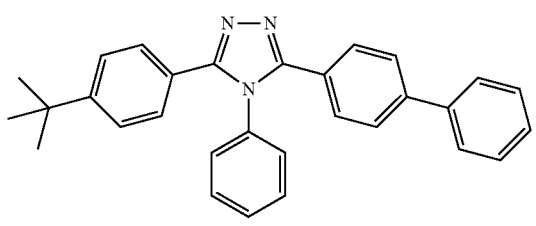

TAZ

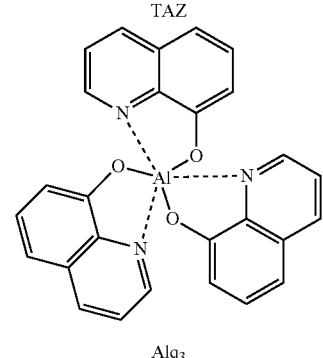

Alq$_3$

The thickness of the electron transport layer 160 may be about 100 Å to about 1000 Å, and in some embodiments, the thickness may be about 150 Å to about 500 Å. When the thickness of the electron transport layer 160 is within these ranges, satisfactory electron transport capabilities may be obtained without a substantial increase in a driving voltage.

In other embodiments, the electron transport layer 160 may include an electron transport organic compound and a metal-containing material. Non-limiting examples of the electron transport organic compound include AND (9,10-di(naphthalene-2-yl)anthracene); and an anthracene-based compound such as Compound 101 and 102, but the electron transport organic compound is not limited thereto.

<Compound 101>

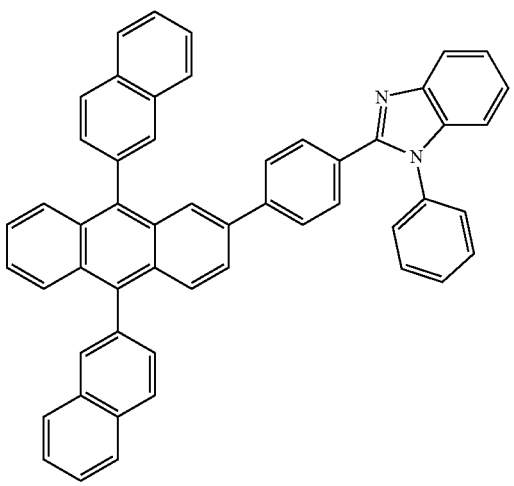

<Compound 102>

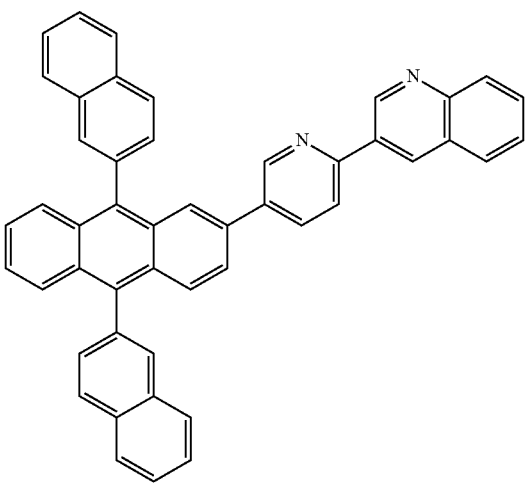

The metal-containing compound may include a lithium (Li) complex. Non-limiting examples of the Li complex include lithium quinolate (LiQ) and Compound 103 below:

<Compound 103>

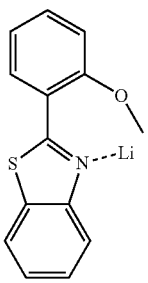

Then, an electron injection layer (EIL) 170 (which facilitates injection of electrons from the second electrode 180) may be laminated on the electron transport layer 160. Any suitable electron-injecting material may be used to form the EIL 170.

Any EIL material, such as LiF, NaCl, CsF, $Li_2O$, or BaO, may be used to form the EIL 170. The conditions for deposition of the EIL 170 may be similar to those described above for the formation of the hole injection layer 140. However, the deposition conditions may vary according to the material that is used to form the EIL 170.

The thickness of the EIL 170 may be about 1 Å to about 100 Å, and in some embodiments, may be about 3 Å to about 90 Å. When the thickness of the EIL 170 is within these ranges, the EIL may have satisfactory electron injection capabilities without a substantial increase in a driving voltage.

The second electrode 180 is formed on the electron injection layer 170 as a common layer. The second electrode 180 may be a cathode, which is an electron injecting electrode. The material for forming the second electrode 180 may be a metal, an alloy, an electro-conductive compound, which have a low work function, or a mixture thereof. In greater detail, the second electrode 180 may include lithium (Li), magnesium (Mg), aluminum (Al group, aluminum-lithium (Al—Li), calcium (Ca), magnesium-indium (Mg—In), magnesium-silver (Mg—Ag), or the like. The second electrode 180 may be formed as a thin film (for example, having a thickness of about 10 Å to about 500 Å) type transmission electrode. In some embodiments, the second electrode 180 may be formed as a transparent electrode by using indium tin oxide (ITO) or indium zinc oxide (IZO) to manufacture a top-emission light emitting device.

Although the organic light-emitting device 100 of FIG. 1 is described above, the present invention is not limited thereto.

The organic light emitting device 100 according to an embodiment of the present invention may be manufactured according to a method including: separately forming a plurality of first electrodes 120 in respective subpixels on the substrate 110 including a first subpixel, a second subpixel, and a third subpixel; forming a third emission layer 150 for emitting a third color light in the third subpixel in the first subpixel, the second subpixel, and the third subpixel; forming a first emission layer 151 for emitting a first color light in the first subpixel; forming a second emission layer 152 for emitting a second color light in the second subpixel; and forming the second electrode 180. The third emission layer 150 includes at least one compound represented by Formula 1 above.

The first emission layer 151 and the second emission layer 152 may be formed after forming the third emission layer 150, but the present invention is not limited thereto.

The first color light, the second color light, and the third color light may each respectively be red colored light, green colored light, and blue colored light. Accordingly, the organic light emitting device may emit a full color spectrum. The first color light, the second color light, and the third color light may be any of a variety of colors, and are not limited to the red light, the green light, and the blue light, provided that the mixed light thereof is white light.

Figure 2:
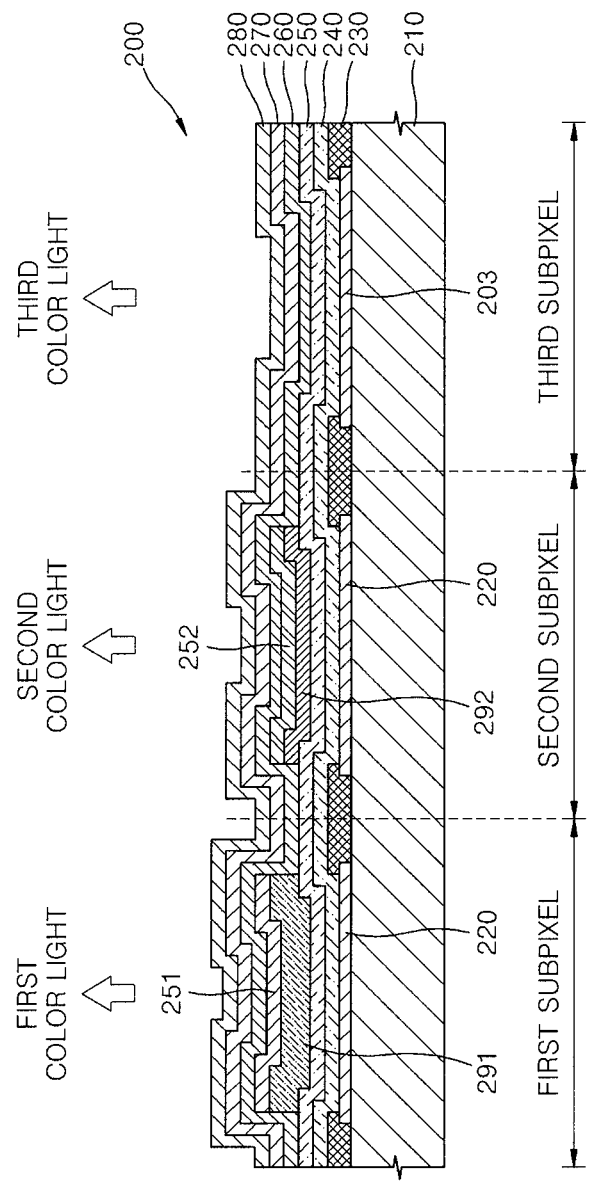
FIG. 2 is a schematic illustration of an organic light emitting device according to another embodiment of the present invention.

FIG. 2 schematically illustrates a cross-section of an organic light emitting device 200 according to another embodiment of the present invention. A substrate of the organic light emitting device includes a first subpixel, a second subpixel, and a third subpixel. A plurality of first electrodes 220 are separately patterned in the first subpixel, the second subpixel, and the third subpixel. On the first electrode 220, a hole injection layer 240 and a third emission layer 250 are formed as common layers. On the third emission layer 250 in the first subpixel, a first auxiliary layer 291 and a first emission layer 251 for emitting the first color light are sequentially formed. On the third emission layer 250 in the second subpixel, a second auxiliary layer 292 and a second emission layer 252 are sequentially formed. On the first emission layer 251 and the second emission layer 252, an electron transport layer 260, an electron injection layer 270, and a second electrode 280 are sequentially formed.

The organic light emitting device 200 may include the first auxiliary layer 291 on the third emission layer 250 in the first subpixel, and the first emission layer 251 on the first auxiliary layer 291. The first auxiliary layer facilitates resonance of the first color light. On the other hand, the second auxiliary layer 292 may be formed on the third emission layer 250 in the second subpixel, and the second emission layer 252 may be formed on the second auxiliary layer 292. When the first color light is red light, the first emission layer 251 may be a red emission layer, and when the second color light is green light, the second emission layer 252 may be a green emission layer.

The first auxiliary layer 291 is a layer disposed between the third emission layer 250 and the first emission layer 251, and may include a hole injection material, a hole transport material, or a material having both hole injection and hole transport capabilities.

The second auxiliary layer 292 is disposed between the third emission layer 250 and the second emission layer 252, and may include a hole transport material, a hole transport material or a material having both hole injection and hole transport capabilities.

In some embodiments, the first auxiliary layer 291 and the second auxiliary layer 292 may include carbazole derivatives such as N-phenylcarbazole, polyvinylcarbazole, N,N'-bis(3-methylphenyl)-N,N'-diphenyl-[1,1-biphenyl]-4,4'-diamine (TPD), TCTA (4,4',4"-tris(N-carbazolyl)triphenylamine), and NPB (NN,N'-di(1-naphthyl)-N,N'-diphenylbenzidine), but the first auxiliary layer is not limited thereto. A material for the first auxiliary layer 291 and a material for the second auxiliary layer 292 may be the same or different.

In addition to the materials described above, the first auxiliary layer 291 and the second auxiliary layer may further include a p-dopant. Non-limiting examples of the p-dopant include quinone derivatives, metal oxides, and compounds with a cyano group. Non-limiting examples of the p-dopant include quinone derivatives such as tetracyanoquinonedimethane (TCNQ), and 2,3,5,6-tetrafluoro-tetracyano-1,4-benzoquinonedimethane (F4-TCNQ); metal oxides such as tungsten oxide, and molybdenum oxide; and cyano-containing compounds such as Compound 100 below.

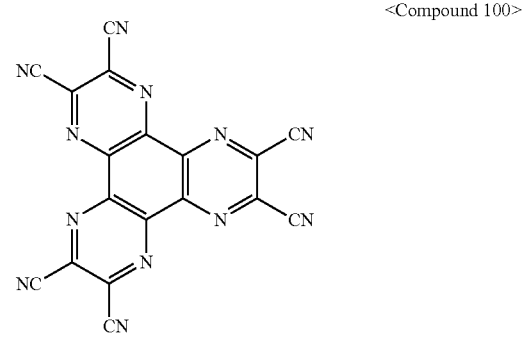 [SMILES: N#Cc1nc2c3nc(C#N)c(C#N)nc3c3nc(C#N)c(C#N)nc3c2nc1C#N]

<Compound 100>

If the first auxiliary layer 291 and the second auxiliary layer 292 further include a p-dopant, the p-dopant may be homogeneously or inhomogeneously dispersed in the first auxiliary layer 291 and the second auxiliary layer 292.

Detailed descriptions of the substrate 210, the first electrode 220, the hole injection layer 240, the hole transport layer (not shown in FIG. 2), the third emission layer 250, the first emission layer 251, the second emission layer 252, the electron transport layer 260, the electron injection layer 270, and the second electrode 280 are provided above in the description of FIG. 1.

While the organic light emitting device and the methods of manufacturing the same have been described with reference to FIGS. 1 and 2, the organic light emitting device of the present invention is not limited thereto.

The organic light emitting device 100 and 200 may be included in a flat display device including a thin film transistor (TFT). The TFT may include a gate electrode, source and drain electrodes, a gate barrier and an active layer. One of the source and drain electrodes may electrically contact the first electrode of the organic light emitting device.

Hereinafter, embodiments of the present invention will be described with reference to the following Synthesis Examples and other Examples. However, these examples are presented for illustrative purposes only and are not intended to limit the scope of the present invention.

SYNTHESIS EXAMPLE

Synthesis of Compound 1

Compound 1 was synthesized according to Reaction Scheme 1 below:

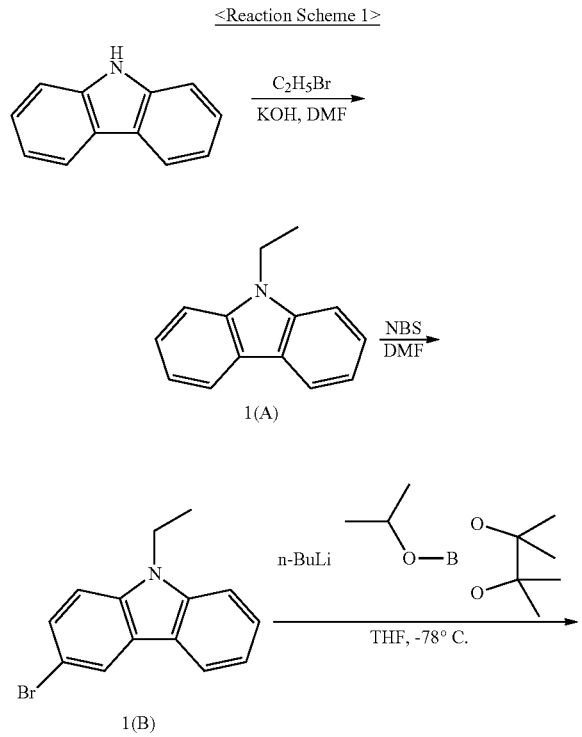

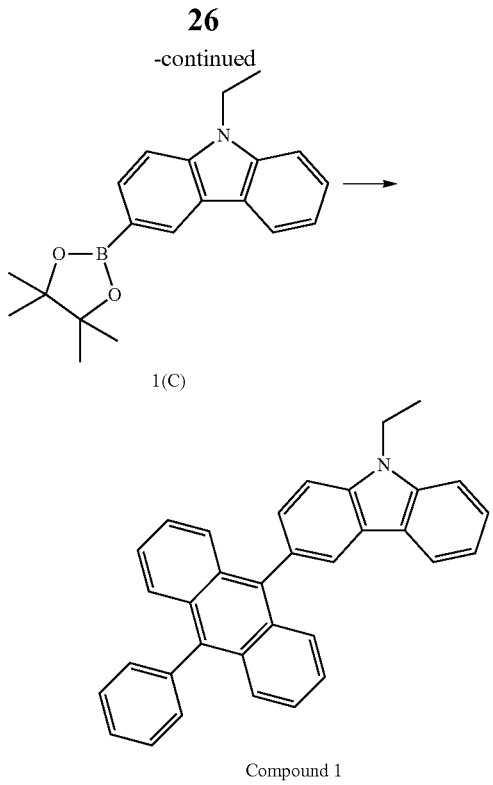

Synthesis of 1(A)

Carbazole (20 g, 119.6 mmol), potassium hydroxide (20.13 g, 358.8 mmol) and bromoethane (39.1 g, 358.8 mmol) were dissolved in DMF (200 ml). The mixture was stirred during overnight at 60° C. After pouring into brine, and washing, the mixture was extracted by dichloromethane. The organic extracts were dried with $MgSO_4$ and concentrated by rotary evaporation. Purification of solid residue by recrystallization in ethanol gave a white solid 1(A) (20 g, 102.4 mmol, 85.6%).

$^1$H NMR (300 MHz, CDCl3, δ): 8.08-8.12 (d, J=7.7 Hz, 2H), 7.44-7.50 (t, J=7.5 Hz, 2H), 7.39-7.42 (d, J=8.1 Hz, 2H), 7.19-7.25 (t, J=6.5 Hz, 2H), 4.34-4.42 (q, J=7.2 Hz, 2H), 1.40-1.47 (t, J=7.2 Hz, 3H).

Synthesis of 1(B)

To solution of 1(A) (6 g, 30.7 mmol) in DMF (80 mL), NBS (5.47 g, 30.7 mmol) was added slowly. The mixture was stirred during overnight at room temperature. After pouring into brine, and washing, the mixture was extracted with dichloromethane. The organic extracts were dried with $MgSO_4$ and concentrated by rotary evaporation. Purification of solid residue by reprecipitation with methanol and THF gave white powder 1(B) (7.16 g, 26.1 mmol, 85%).

$^1$H NMR (300 MHz, CDCl3, δ): 8.2 (s, 1H), 8.02-8.07 (d, J=8.1 Hz, 1H), 7.52-7.56 (d, J=8.7 Hz, 1H), 7.46-7.52 (t, J=7.2 Hz, 1H), 7.38-7.44 (d, J=8.1 Hz, 1H), 7.27-7.31 (d, J=8.7 Hz, 1H), 7.21-7.27 (t, J=6.9 Hz, 1H), 4.28-4.39 (q, J=7.2 Hz, 2H), 1.40-1.47 (t, J=7.2 Hz, 3H).

Synthesis of 1(C)

To a solution of 1(C) (2.5 g, 9.12 mmol) in anhydrous THF (100 mL) at −78° C., 8.53 ml (13.68 mmol) of n-butyllithium (1.6 M in hexane) was added. The mixture was stirred at −78° C. for 2 h. 3.72 ml (18.2 mmol) of 2-isopropoxy-4,4,5,5-tetramethyl-[1,3,2]-dioxaborolane was added rapidly to the solution, and the resulting mixture was warmed to room temperature and stirred during overnight. The mixture was poured into water and extracted with MC. The organic extracts were washed with brine and dried with MgSO$_4$. The solvent was removed by rotary evaporation, and reprecipitation with methanol and THF gave product 1(C) (1.48 g, 4.51 mmol, 51%). 1H NMR (300 MHz, CDCl 3, δ): 8.6 (s, 1H), 8.12-8.17 (d, J=7.8 Hz, 1H), 7.9-7.96 (d, J=7.8 Hz, 1H), 7.44-7.51 (t, J=8.1 Hz, 1H), 7.39-7.44 (d, J=8.4 Hz, 1H), 7.21-7.28 (t, J=6.6 Hz, 1H), 4.34-4.42 (q, J=7.2 Hz, 2H), 1.41-1.46 (t, J=7.2 Hz, 3H), 1.40 (s, 12H).

Synthesis of Compound 1

1(C) (1.4 g, 4.36 mmol), 9-bromo-10-phenylanthracene (1.18 g, 4.6 mmol) and tetrakis(triphenylphosphine) palladium(0) (0.05 g, 0.044 mmol) were added to a round-bottomed flask equipped with a reflux condenser and dissolved in 45 ml of THF. After adding 15 ml of aqueous 2N sodium carbonate solution, the reaction mixture was heated at 80 for 24 h. The cooled crude mixture was poured into water and extracted with CH$_2$Cl$_2$ and dried with MgSO$_4$, filtered, and evaporated to yield a crude product. Flash column chromatography using ethylacetate:n-hexane (1:4) followed by reprecipitation with methanol and THF gave Compound 1.

EXAMPLE

After preparing a substrate including a thin film transistor, an ITO (available from Samsung SDI Co., Ltd.) first electrode having a thickness of 500 Å was formed in a stripe pattern. In this regard, the first electrode was formed such that the first electrode electrically contacts the source electrode or the drain electrode of a thin film transistor included on the bottom of the substrate.

On the first electrode, pixel defining layers defining regions to be provided with red and blue emission layers were formed using silicon oxide. Then, NPB was deposited to form a hole injection layer (as a common layer) having a thickness of 1200 Å.

On the hole injection layer, Compound 1 and NDP-9 were vacuum deposited in a weight ratio of 98:2 to form a blue emission layer having a thickness of 100 Å.

On the blue emission layer in the red subpixel, NPB and NDP-9 were vacuum deposited in a weight ratio of 98:2 to form a first auxiliary layer having a thickness of 50 Å, and NPB was vacuum deposited at a thickness of 400 Å on the first auxiliary layer. Then, NPB was vacuum deposited at a thickness of 400 Å and 1,3,5-tris(carbazol-9-yl)benzene (BPhen) was deposited to form a red emission layer having a thickness of 400 Å.

Thereafter, after forming the electron transport layer (as a common layer) having a thickness of 350 Å by depositing 4,7-diphenyl-1,10-phenanthroline and LiQ in a weight ratio of 5:5, LiQ was deposited to form an electron injection layer (as a common layer) having a thickness of about 10 Å. On the electron injection layer, Mg:Ag was vacuum deposited in a weight ratio of 90:10 to form a second electrode (as a common layer) having a thickness of 150 Å to form an organic light emitting device emitting both red light and blue light.

The driving voltage, current density, emission efficiency and color coordinates of the Example above were evaluated using a PR650 available from Photo Research.

At a driving voltage of 4.2 V, the current density was 7.6 mA/cm$^2$, the color coordinate was 0.670, and the emission efficiency was 48.4 cd/A.

The organic light emitting device of the Example has low driving voltage.

An organic light emitting device according to an embodiment of the present invention has a reduced driving voltage.

While the present invention has been illustrated and described with reference to certain exemplary embodiments thereof, it will be understood by those of ordinary skill in the art that various changes in form and details may be made to the described embodiments without departing from the spirit and scope of the present invention as defined by the following claims.

What is claimed is:

1. An organic light emitting device, comprising:
a substrate comprising a first subpixel, a second subpixel, and a third subpixel;
a plurality of first electrodes in the first subpixel, the second subpixel, and the third subpixel;
a second electrode facing the first electrode; and
an emission layer between the first electrode and the second electrode, the emission layer comprising:
  i) a first emission layer in the first subpixel for emitting a first color light in the first subpixel,
  ii) a second emission layer in the second subpixel for emitting a second color light in the second subpixel, and
  iii) a third emission layer in the first subpixel, the second subpixel and the third subpixel, for emitting a third color light in the third subpixel, the third emission layer comprising at least one compound represented by Formula 1:

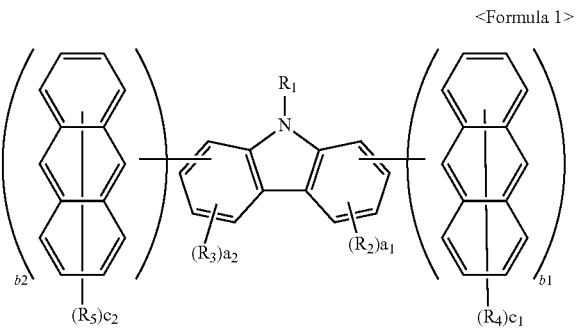

<Formula 1> wherein, in Formula 1, $R_1$ to $R_5$ may be each independently selected from a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group or a substituted or unsubstituted $C_6$-$C_{60}$ arylthio group;

a1 and a2 are each independently an integer of 0 to 4;

b1 and b2 are each independently an integer of 0 to 4;

a1+b1 is 4;

a2+b2 is 4;

c1 and c2 are each independently an integer of 0 to 9; and b1 and b2 are not both 0.

2. The organic light emitting device of claim 1, wherein the third emission layer comprises a first region located in the first subpixel, a second region located in the second subpixel, and a third region located in the third subpixel, wherein the first region is between the first emission layer and the first electrode, and the second region is between the second emission layer and the first electrode, and wherein the third color light is configured to be emitted from the third region.

3. The organic light emitting device of claim 1, wherein the first color light, the second color light and the third color light are red light, green light, and blue light, respectively.

4. The organic light emitting device of claim 1, wherein b1 and b2 are each independently an integer of 0 to 2.

5. The organic light emitting device of claim 1, wherein b1 is 1 and b2 is 0.

6. The organic light emitting device of claim 1, wherein the at least one compound represented by Formula 1 comprises at least one compound represented by Formula 2:

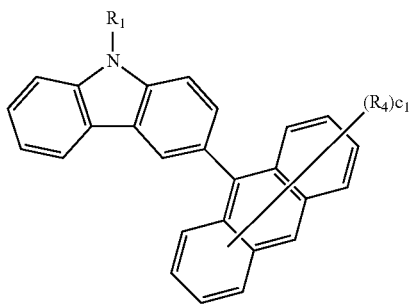

<Formula 2> wherein, in Formula 2, $R_1$ and $R_4$ are each independently selected from:

a $C_1$-$C_{10}$ alkyl group;

a $C_6$-$C_{14}$ aryl group;

a $C_2$-$C_{14}$ heteroaryl group;

a $C_1$-$C_{10}$ alkyl group, a $C_6$-$C_{14}$ aryl group or a $C_2$-$C_{14}$ heteroaryl group substituted with at least one of a deuterium atom, a halogen atom, a hydroxyl group, a cyano group, a nitro group or a carboxyl group;

a $C_1$-$C_{10}$ alkyl group, a $C_6$-$C_{14}$ aryl group or a $C_2$-$C_{14}$ heteroaryl group substituted with at least one of a methyl group, an ethyl group, an n-propyl group, an iso-propyl group, an n-butyl group, an iso-butyl group, a tert-butyl group, a pentyl group or a hexyl group; or a $C_1$-$C_{10}$ alkyl group, a $C_6$-$C_{14}$ aryl group or a $C_2$-$C_{14}$ heteroaryl group substituted with at least one of a phenyl group, a naphthyl group, an anthryl group, a carbazolyl group, a fluorenyl group, a pyridinyl group, a pyrimidinyl group, a pyrazinyl group or a triazinyl group, wherein c1 is an integer of 0 or 1.

7. The organic light emitting device of claim 1, wherein the at least one compound represented by Formula 1 comprises at least one compound represented by Formula 3:

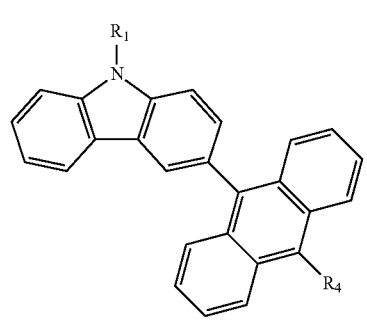

<Formula 3> wherein, in Formula 3, $R_1$ and $R_4$ are each independently selected from:

a methyl group, an ethyl group, an n-propyl group, an iso-propyl group, an n-butyl group, an iso-butyl group, a tert-butyl group, a pentyl group or a hexyl group;

a phenyl group, a naphthyl group, an anthryl group, or a fluorenyl group;

a carbazolyl group, a pyridyl group, a pyrimidinyl group, a pyrazinyl group, or a triazinyl group;

a methyl group, an ethyl group, an n-propyl group, an iso-propyl group, an n-butyl group, an iso-butyl group, a tert-butyl group, a pentyl group, a hexyl group, a phenyl group, a naphthyl group, an anthryl group, a fluorenyl group, a carbazolyl group, a pyridinyl group, a pyrimidinyl group, a pyrazinyl group or a triazinyl group substituted with at least one of deuterium atom, a halogen atom, a hydroxyl group, a cyano group, a nitro group, or a carboxyl group;

a methyl group, an ethyl group, an n-propyl group, an iso-propyl group, an n-butyl group, an iso-butyl group, a tert-butyl group, a pentyl group, a hexyl group, a phenyl group, a naphthyl group, an anthryl group, a fluorenyl group, a carbazolyl group, a pyridyl group, a pyrimidinyl group, a pyrazinyl group or a triazinyl group substituted with at least one of a methyl group, an ethyl group, an n-propyl group, an iso-propyl group, an n-butyl group, an iso-butyl group, a tert-butyl group, a pentyl group or a hexyl group; or a methyl group, an ethyl group, an n-propyl group, an iso-propyl group, an n-butyl group, an iso-butyl group, a t-butyl group, a pentyl group, a hexyl group, a phenyl group, a naphthyl group, an anthryl group, a fluorenyl group, a carbazolyl group, a pyridyl group, a pyrimidinyl group, a pyrazinyl group or a triazinyl group substituted with at least one of a phenyl group, a naphthyl group, an anthryl group, a carbazolyl group, a fluorenyl group, a pyridyl group, a pyrimidinyl group, a pyrazinyl group or a triazinyl group.

8. The organic light emitting device of claim 7, wherein $R_1$ is selected from:

a methyl group, an ethyl group, an n-propyl group, an iso-propyl group, an n-butyl group, an iso-butyl group, a tert-butyl group, a pentyl group or a hexyl group;

a phenyl group, a naphthyl group, an anthryl group, or a fluorenyl group; or a methyl group, an ethyl group, an n-propyl group, an iso-propyl group, an n-butyl group, an iso-butyl group, a tert-butyl group, a pentyl group, a hexyl group, a phenyl group, a naphthyl group, an anthryl group, or a fluorenyl group substituted with at least one of a phenyl group, a naphthyl group, an anthryl group or a fluorenyl group; and R₄ is selected from:
 a phenyl group, a naphthyl group, an anthryl group or a fluorenyl group; or
 a phenyl group, a naphthyl group, an anthryl group or a fluorenyl group substituted with at least one of a phenyl group, a naphthyl group, an anthryl group or a fluorenyl group.

9. The organic light emitting device of claim 1, wherein the compound represented by Formula 1 comprises at least one of Compounds 1 to 4:

<Compound 1>
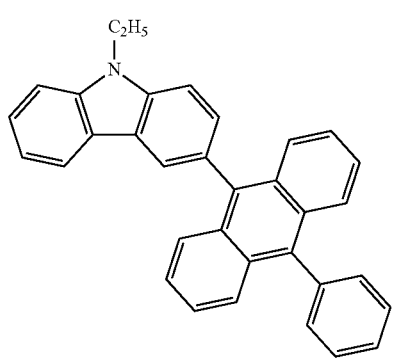

<Compound 2>
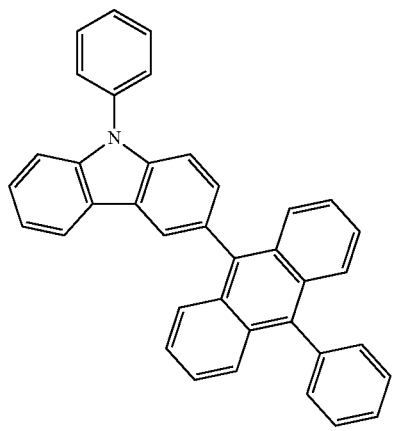

<Compound 3>
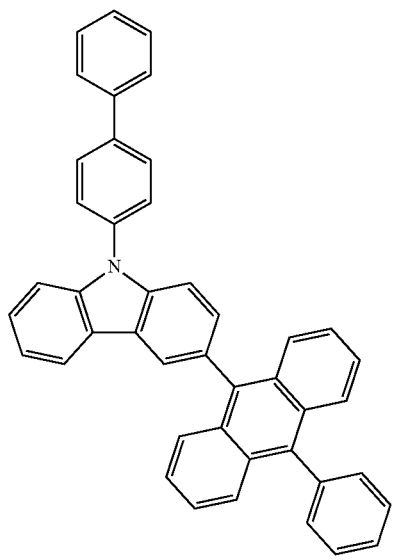

-continued

<Compound 4>
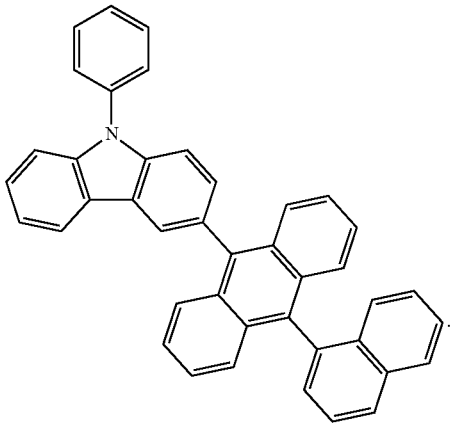

10. The organic light emitting device of claim 1, wherein an absolute value of a HOMO of the compound represented by Formula 1 is about 5.0 eV to about 5.5 eV.

11. The organic light emitting device of claim 2, further comprising a hole injection layer between the third emission layer and the first electrode, wherein the hole injection layer directly contacts the third emission layer, and a difference between an absolute value of a HOMO of the compound represented by Formula 1 and an absolute value of a HOMO of the hole injection layer is 0.5 eV or less.

12. The organic light emitting device of claim 1, wherein the third emission layer further comprises a dopant.

13. The organic light emitting device of claim 12, wherein an amount of the dopant is about 0.01 parts by weight to about 15 parts by weight based on 100 parts by weight of the compound represented by Formula 1.

14. The organic light emitting device of claim 1, wherein the third emission layer comprises a first region in the first subpixel, a second region in the second subpixel, and a third region in the third subpixel,
 wherein the first region is between the first emission layer and the first electrode, and the second region is between the second emission layer and the first electrode,
 wherein the third color light is configured to be emitted from the third region,
 wherein the third emission layer further comprises a blue dopant,
 wherein the compound represented by Formula 1 in the third region is a host, and the blue dopant in the third region is a dopant for emitting blue light.

15. The organic light emitting device of claim 1, further comprising at least one of a hole injection layer, a hole transport layer, a layer having both hole injection and hole transport capabilities, a buffer layer, or an electron blocking layer between the first electrode and the emission layer, and at least one of a hole blocking layer, a hole transport layer, or an electron injection layer between the emission layer and the second electrode.

16. The organic light emitting device of claim 2, further comprising a first auxiliary layer between the first region and the first emission layer, and a second auxiliary layer between the second region and the second emission layer.

17. The organic light emitting device of claim 16, wherein at least one of the first auxiliary layer or the second auxiliary layer further comprises a p-dopant.

18. A method of manufacturing an organic light emitting device, the method comprising:
 separately forming a plurality of first electrodes in subpixels on a substrate, the subpixels comprising a first subpixel, a second subpixel, and a third subpixel;

forming a third emission layer in the first subpixel, the second subpixel, and the third subpixel, wherein a region of the third emission layer in the third subpixel is configured to emit a third color light;

forming a first emission layer for emitting a first color light in the first subpixel;

forming a second emission layer for emitting a second color light in the second subpixel; and forming a second electrode, wherein the third emission layer includes at least one compound represented by Formula 1:

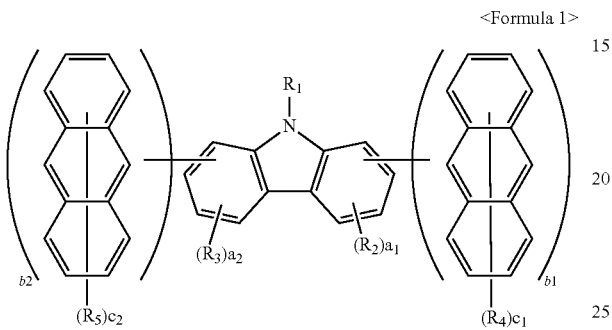

<Formula 1> wherein, in Formula 1, $R_1$ to $R_5$ are each independently selected from a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_3$-$C_{60}$ cycloalkyl group, a substituted or unsubstituted $C_1$-$C_{60}$ alkoxy group, a substituted or unsubstituted $C_6$-$C_{60}$ aryl group, a substituted or unsubstituted $C_2$-$C_{60}$ heteroaryl group, a substituted or unsubstituted $C_6$-$C_{60}$ aryloxy group or a substituted or unsubstituted $C_6$-$C_{60}$ arylthio group;

a1 and a2 are each independently an integer of 0 to 4;

b1 and b2 are each independently an integer of 0 to 4;

a1+b1 is 4;

a2+b2 is 4;

c1 and c2 are each independently an integer of 0 to 9; and b1 and b2 are not both 0.

19. The method of claim 18, wherein the first emission layer and the second emission layer are formed after forming the third emission layer.

20. The method of claim 18, wherein the first color light, the second color light, and the third color light are each respectively red colored light, green colored light, and blue colored light.

* * * * *